(12) United States Patent
Tamura et al.

(10) Patent No.: US 12,733,204 B2
(45) Date of Patent: Sep. 8, 2026

(54) SEMICONDUCTOR DEVICE AND METHOD OF MANUFACTURING THE SAME

(71) Applicant: ROHM CO., LTD., Kyoto (JP)

(72) Inventors: Kazuhiro Tamura, Kyoto (JP); Naoki Izumi, Kyoto (JP); Yusuke Shimizu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 304 days.

(21) Appl. No.: 18/459,699

(22) Filed: Sep. 1, 2023

(65) Prior Publication Data

US 2024/0097028 A1 Mar. 21, 2024

(30) Foreign Application Priority Data

Sep. 16, 2022 (JP) ................................ 2022-148388

(51) Int. Cl.
*H10D 30/65* (2025.01)
*H10D 30/01* (2025.01)
*H10D 62/13* (2025.01)
*H10D 62/17* (2025.01)

(52) U.S. Cl.
CPC ....... *H10D 30/657* (2025.01); *H10D 30/0281* (2025.01); *H10D 62/153* (2025.01); *H10D 62/157* (2025.01); *H10D 62/393* (2025.01)

(58) Field of Classification Search
CPC .. H10D 30/657; H10D 62/153; H10D 62/157; H10D 62/393; H10D 64/01322; H10D 30/603; H10D 30/0221; H10D 64/516; H10D 64/671; H10D 62/307; H10D 64/111; H10D 30/0281–0289; H10D 30/65–659; H10D 64/662–664
See application file for complete search history.

(56) References Cited

U.S. PATENT DOCUMENTS

2015/0137230 A1* 5/2015 Liao ....................... H10D 30/65 438/286
2023/0023179 A1* 1/2023 Ji ........................... H10D 30/65
2024/0055503 A1* 2/2024 Elhami Khorasani ....................... H10D 64/516

FOREIGN PATENT DOCUMENTS

JP 2001502846 A 2/2001
JP 2009212237 A 9/2009
(Continued)

OTHER PUBLICATIONS

Office Action issued for corresponding Japanese application No. JP2022-148388, and its English translation, dated Mar. 12, 2026.

*Primary Examiner* — Shahed Ahmed
(74) *Attorney, Agent, or Firm* — Rabin & Berdo. P.C.

(57) ABSTRACT

A semiconductor device includes an n-type semiconductor layer, a p-type drift region formed in a surface layer portion of the semiconductor layer, an n-type body region formed in the surface layer portion of the semiconductor layer, a p-type drain region formed in a surface layer portion of the drift region, a p-type source region formed in a surface layer portion of the body region, a gate insulating film formed on a surface of the semiconductor layer, and a polysilicon gate formed on the gate insulating film, wherein a region extending from the source region to a side edge of the drift region is a channel region, and wherein the polysilicon gate includes a p-type first portion facing at least a portion of the channel region, and an n-type second portion facing at least a portion of the drift region.

8 Claims, 17 Drawing Sheets

(56) References Cited

FOREIGN PATENT DOCUMENTS

| | | | |
|---|---|---|---|
| JP | 2013251497 | A | 12/2013 |
| JP | 2016-027622 | A | 2/2016 |

* cited by examiner

P-type gate
Gate insulating film
P-type drift layer
Ec
Et
Ev
Comparative example
N-type gate
Gate insulating film
P-type drift layer
Δ = 1V
Ec
Ev
Present embodiment

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2022-148388, filed on Sep. 16, 2022, the entire contents of which are incorporated herein by reference.

TECHNICAL FIELD

The present disclosure relates to a semiconductor device and a method of manufacturing the same.

BACKGROUND

In the related art, there has been known a DMOSFET (Double Diffused Metal Oxide Semiconductor Field Effect Transistor), which includes a deep n-well formed on a silicon substrate, a p-type region formed in a surface layer portion of the deep n-well, an n-type well formed in the surface layer of the deep n-well which is spaced apart from the p-type region, a p-type drain region formed in a surface layer portion of the p-type region, a p-type source region formed in a surface layer portion of the n-type well, a gate insulating film formed on the surface of the deep n-well so as to straddle the p-type region and the n-type well, and a gate electrode formed on the gate insulating film. In the related art, the p-type region includes a p-type drift layer and a p-type well.

BRIEF DESCRIPTION OF DRAWINGS

The accompanying drawings, which are incorporated in and constitute a part of the specification, illustrate embodiments of the present disclosure.

FIG. 6A is a cross-sectional view showing an example of a manufacturing process of the semiconductor device shown in FIGS. 1 and 2, and is a cross-sectional view which corresponds to the cross section of FIG. 1.

FIG. 6B is a cross-sectional view showing a next step of FIG. 6A.

FIG. 6F is a cross-sectional view showing a next step of FIG. 6E.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An embodiment of the present disclosure will now be described in detail with reference to the accompanying drawings.

Figure 1:
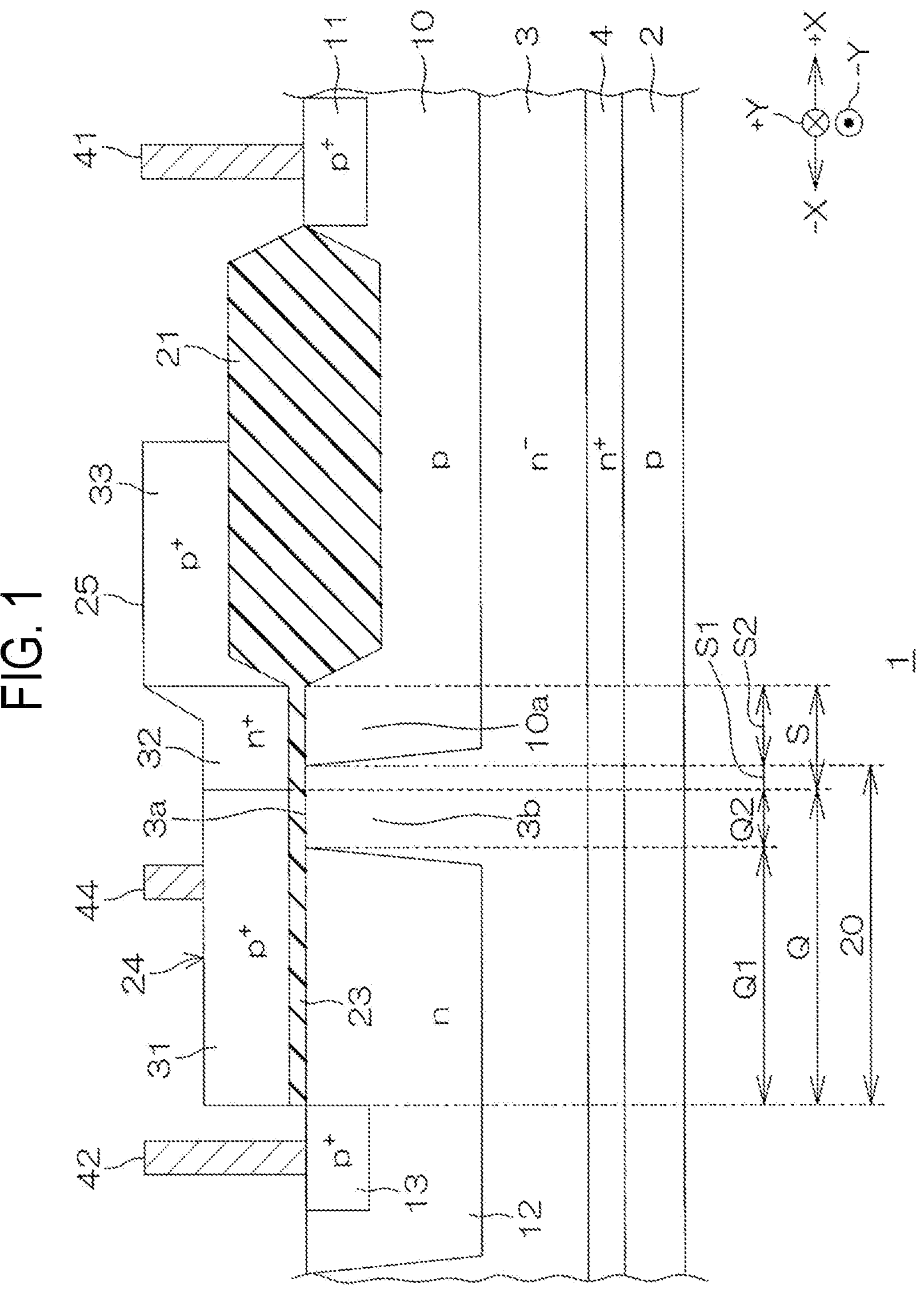
FIG. 1 is a schematic partial cross-sectional view showing a structure of a main part of a semiconductor device according to an embodiment of the present disclosure.
Figure 2:
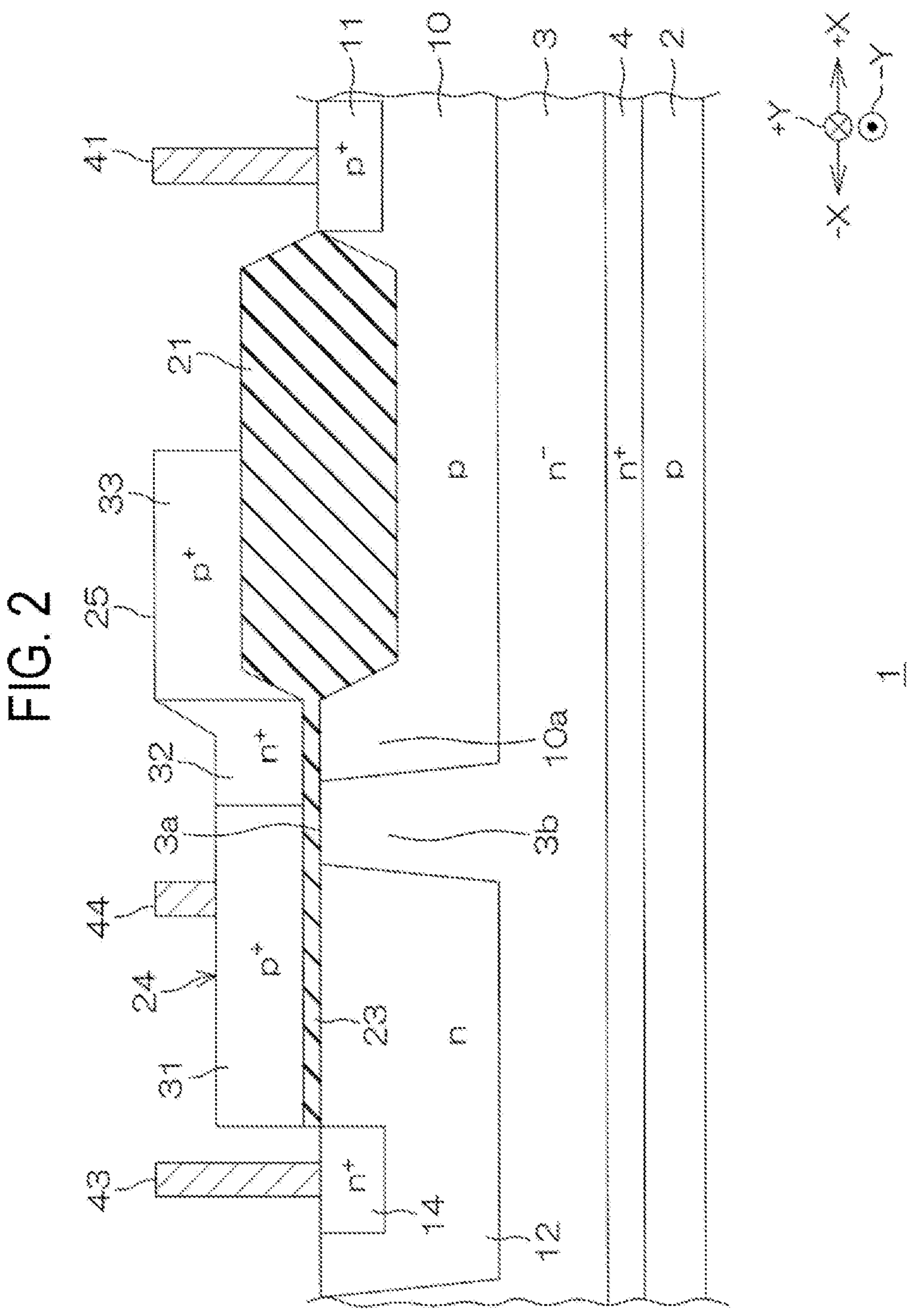
FIG. 2 is a schematic partial cross-sectional view showing a structure of a main part of a semiconductor device according to an embodiment of the present disclosure, and is a cross-sectional view which is different from FIG. 1 in a Y direction position.

FIG. 1 is a schematic partial cross-sectional view showing a structure of a main part of a semiconductor device according to an embodiment of the present disclosure. FIG. 2 is a schematic partial cross-sectional view showing the structure of the main part of the semiconductor device according to the embodiment of the present disclosure, and is a cross-sectional view which is different from FIG. 1 in a Y direction position.

For the sake of convenience of description, a +X direction, a −X direction, a +Y direction, and a −Y direction shown in FIGS. 1 and 2 may be used hereinafter. The +X direction is a predetermined direction along a surface of a semiconductor substrate 2 in a plan view, and the +Y direction is a direction along the surface of the semiconductor substrate 2 in a plan view and perpendicular to the +X direction. The −X direction is a direction opposite to the +X direction. The −Y direction is a direction opposite to the +Y direction. The +X direction and the −X direction are collectively and simply referred to as an "X direction." The +Y direction and the −Y direction are collectively and simply referred to as a "Y direction."

In this embodiment, the semiconductor device 1 is a p-channel LDMOSFET (Lateral Double Diffused Metal Oxide Semiconductor Field Effect Transistor).

The semiconductor device 1 includes a semiconductor substrate 2 and an epitaxial layer 3 formed on the semiconductor substrate 2. The semiconductor device 1 includes an embedded layer 4 selectively formed at a boundary between the semiconductor substrate 2 and the epitaxial layer 3 to straddle the semiconductor substrate 2 and the epitaxial layer 3. Although not shown in FIGS. 1 and 2, the epitaxial layer 3 is in contact with a surface of the semiconductor substrate 2 at a location where the embedded layer 4 is not formed.

The semiconductor substrate 2 is composed of a silicon (Si) substrate in the present embodiment. The semiconductor substrate 2 may be a substrate other than a silicon substrate, such as a silicon carbide (SiC) substrate or the like. The semiconductor substrate 2 is a p type in the present embodiment. The semiconductor substrate 2 has an impurity concentration of, for example, $1\times10^{14}$ $cm^{-3}$ to $1\times10^{18}$ $cm^{-3}$. In present embodiment, the semiconductor substrate 2 has a p-type impurity concentration of about $1.5\times10^{15}$ $cm^{-3}$. A thickness of the semiconductor substrate 2 is, for example, 500 μm to 800 μm before polishing.

The epitaxial layer 3 has an element main surface 3*a* on a side opposite to the semiconductor substrate 2 side. The epitaxial layer 3 is an example of a "semiconductor layer" of the present disclosure. The epitaxial layer 3 is made of silicon (Si) in the present embodiment. The epitaxial layer 3 may be made of a material other than silicon, such as silicon carbide (SiC) or the like. The epitaxial layer 3 is an n type. As an n-type impurity, for example, P (phosphorus), As (arsenic), Sb (antimony), or the like may be applied (the same applies hereinafter).

An n-type impurity concentration of the epitaxial layer 3 is, for example, about $5\times10^{14}$ $cm^{-3}$ to $1\times10^{17}$ $cm^{-3}$. In the present embodiment, the n-type impurity concentration of the epitaxial layer 3 is about $4\times10^{14}$ $cm^{-3}$. A film thickness of the epitaxial layer 3 is, for example, 3 μm to 20 μm. In the present embodiment, the thickness of the epitaxial layer 3 is about 10 μm.

The embedded layer 4 is an n type. The embedded layer 4 has a higher n-type impurity concentration than the epitaxial layer 3. A film thickness of the embedded layer 4 is, for example, 2 μm to 10 μm. In the present embodiment, the thickness of the embedded layer 4 is about 5 μm.

A p-type drift region 10 is formed in a surface layer portion of the epitaxial layer 3 on an element main surface 3*a* side. The drift region 10 includes a quadrangular portion extending in the Y direction in a plan view. As a p-type impurity, for example, B (boron), Al (aluminum), Ga (gallium), or the like may be applied (the same applies hereinafter). A p-type impurity concentration of the drift region 10 is, for example, $5.0\times10^{15}$ $cm^{-3}$ to $2.0\times10^{16}$ $cm^{-3}$. In the present embodiment, the p-type impurity concentration of the drift region 10 is $1.0\times10^{16}$ $cm^{-3}$.

A p-type drain region 11 having a p-type impurity concentration higher than that of the drift region 10 is formed in a surface layer portion of the drift region 10. The drain region 11 has a quadrangular shape elongated in the Y direction in a plan view.

An n-type body region 12 is formed in the surface layer portion of the element main surface 3*a* side of the epitaxial layer 3 so as to be spaced apart from the drift region 10. In FIGS. 1 and 2, the body region 12 is arranged on the −X side with respect to the drift region 10. The body region 12 may be in contact with the drift region 10. That is, the body region 12 may be formed adjacent to the drift region 10. The body region 12 has a quadrangular shape elongated in the Y direction in a plan view.

The n-type impurity concentration of the body region 12 is, for example, $5.0\times10^{16}$ $cm^{-3}$ to $2.0\times10^{17}$ $cm^{-3}$. In the present embodiment, the n-type impurity concentration of the body region 12 is, for example, $1.0\times10^{17}$ $cm^{-3}$.

In the present embodiment, the epitaxial layer 3 exists between the body region 12 and the drift region 10 in the X direction. The epitaxial layer 3, which exists between the body region 12 and the drift region 10, may be referred to as a narrow portion 3*b* of the epitaxial layer 3.

A p-type source region 13 (see FIG. 1) having a p-type impurity concentration higher than that of the drift region 10 and an n-type body contact region 14 (see FIG. 2) having an n-type impurity concentration higher than that of the body region 12 are formed in the surface layer portion of the body region 12 so as to be alternately arranged in the Y direction.

A channel region 20 is a region, which is located between the source region 13 and the drift region 10, in the surface layer portions of the body region 12 and the narrow portion 3*b* of the epitaxial layer 3. The channel region 20 is a region in which conduction and non-conduction between a drain and a source are controlled.

A field insulating film 21 selectively covering the drift region 10 is formed on the element main surface 3*a* of the epitaxial layer 3. In the present embodiment, the field insulating film 21 is composed of a LOCOS (Local Oxidation of Silicon) oxide film.

In FIGS. 1 and 2, a side edge of the field insulating film 21 on the body region 12 side is located on a +X side of a side edge of the drift region 10 on the body region 12 side. Hereinafter, in a plan view, a portion of the drift region 10 closer to the body region 12 than the side edge of the field insulating film 21 on the body region 12 side may be referred to as a channel-side region 10*a* of the drift region 10.

The side edge of the field insulating film 21 opposite to the side edge of the field insulating film 21 on the body region 12 side coincides with a −X side edge of the drain region 11.

A gate insulating film 23 is formed on the element main surface 3*a* of the epitaxial layer 3 between the source region 13 and the field insulating film 21. A +X side edge of the gate insulating film 23 is connected to the −X side edge of the field insulating film 21. The gate insulating film 23 is formed so as to straddle the drift region 10 and the body region 12. It is desirable that the gate insulating film 23 includes a silicon oxide film.

The gate insulating film 23 has a thickness smaller than that of the field insulating film 21. The gate insulating film 23 covers the channel region 20 and the channel side region 10*a* of the drift region 10. Specifically, the gate insulating film 23 covers a portion of the body region 12 closer to the drift region 10 than the source region 13 (body contact region 14), the narrow portion 3*b* of the epitaxial layer 3, and the channel side region 10*a* of the drift region 10.

A gate electrode 24 is formed on the gate insulating film 23. The gate electrode 24 includes a quadrangular portion extending in the Y direction in a plan view. In the present embodiment, the gate electrode 24 contains conductive polysilicon. Such a gate electrode 24 may be referred to as a "poly-gate" or "polysilicon gate."

The gate electrode 24 faces the channel region 20 and the channel side region 10*a* of the drift region 10 with the gate insulating film 23 interposed therebetween. Specifically, the gate electrode 24 faces the portion of the body region 12 closer to the drift region 10 than the source region 13 (body contact region 14), the narrow portion 3*b* of the epitaxial layer 3, and the channel side region 10*a* of the drift region 10, with the gate insulating film 23 interposed therebetween.

In the present embodiment, the gate electrode 24 includes a lead portion 25 which extends from above the gate insulating film 23 to above the field insulating film 21. The lead portion 25 is formed so as to be spaced apart from the drain region 11 toward the edge of the drift region 10 on the body region 12 side in a plan view, and faces the drift region 10 with the field insulating film 21 interposed therebetween.

The gate electrode (polysilicon gate) 24 includes a p-type first portion 31 facing at least a portion of the channel region 20 with the gate insulating film 23 interposed therebetween, and an n-type second portion 32 facing at least a portion of the drift region 10 with the gate insulating film 23 interposed therebetween.

In the present embodiment, the first portion 31 faces a region Q of the channel region 20 except a region closer to the drift region 10 with the gate insulating film 23 interposed therebetween. Specifically, the first portion 31 faces a region Q1 of the body region 12 extending from the source region 13 (body contact region 14) to the side edge of the body region 12 on the drift region 10 side, and a region Q2 of the narrow portion 3*b* of the epitaxial layer 3 except the region closer to the drift region 10, with the gate insulating film 23 interposed therebetween.

In the present embodiment, the second portion 32 faces a region S1 of the channel region 20 closer to the drift region 10 and a region S2 of the drift region 10 closer to the channel region 20 with the gate insulating film 23 interposed therebetween. Specifically, the second portion 32 faces the region S1 of the channel region 20 closer to the drift region 10 and the region S2 (channel side region 10*a*) of the drift region 10 extending from a side edge of the channel region 20 of the drift region 10 to the field insulating film 21, with the gate insulating film 23 interposed therebetween.

More specifically, the second portion 32 faces the region S1 of the narrow portion 3*b* of the epitaxial layer 3 closer to the drift region 10 and the region S2 (channel side region 10*a*) of the drift region 10 extending from a side edge of the drift region 10 on the body region 12 side to the first field insulating film 21, with the gate insulating film 23 interposed therebetween.

In the present embodiment, the lead portion 25 includes a p-type third portion 33 facing at least a portion of the drift region 10 with the gate insulating film 23 interposed therebetween.

The semiconductor device 1 includes a plurality of drain contact electrodes 41, a plurality of source contact electrodes 42, a plurality of body contact electrodes 43, and a plurality of gate contact electrodes 44.

The plurality of drain contact electrodes 41 are arranged at intervals in the Y direction. Each drain contact electrode 41 is electrically connected to the drain region 11. The drain contact electrodes 41 apply a drain potential Vd to the drain region 11.

The plurality of source contact electrodes 42 are arranged at intervals in the Y direction. Each source contact electrode 42 is electrically connected to the source region 13. The source contact electrodes 42 apply a source potential Vs to the source region 13.

The plurality of body contact electrodes 43 are arranged at intervals in the Y direction. Each body contact electrode 43 is electrically connected to the body contact region 14. The body contact electrodes 43 apply a source potential Vs to the body contact region 14.

The plurality of gate contact electrodes 44 are arranged at intervals in the Y direction. Each gate contact electrode 44 is electrically connected to the gate electrode 24. The gate contact electrodes 44 apply a gate potential Vg to the gate electrode 24.

The semiconductor device 1 is configured to allow a drain/source current to flow during an ON operation. During the ON operation, the source region 13 is applied with a source potential Vs (for example, Vs=0 V), the drain region 11 is applied with a drain potential Vd (for example, Vd=−80 V), and the gate electrode 24 is applied with a gate potential Vg (for example, Vd=−1.5 V).

Hereinafter, a semiconductor device in which the second portion 32 is a p type instead of an n type in the semiconductor device 1 of FIG. 1 will be referred to as a comparative example. That is, in the comparative example, the gate electrode 24 is made of p-type polysilicon.

It was found that the gate insulating film 23 may be damaged in the comparative example. In the comparative example, during the ON operation, electrons are accelerated by a voltage applied between the source and the drain, and are collided with atoms to generate electron (hot electron)-hole pairs. That is, the electron-hole pairs are generated in the drift region 10 by impact ionization. The impact ionization tends to occur in the vicinity of a boundary with the n-type epitaxial layer 3 in the drift region 10 where an electric field tends to concentrate. When the body region 12 is formed so as to contact the drift region 10, the impact ionization is likely to occur in the vicinity of the boundary with the body region 12 in the drift region 10.

An interface trap is formed at an interface between the gate insulating film 23 and the epitaxial layer 3 by the electron-hole pairs generated by the impact ionization. When the interface trap is formed, electrons are trapped in the interface trap. A strong electric field is generated in the gate insulating film 34 by the electrons trapped in the interface trap, and the gate insulating film 34 is damaged. This increases a gate leakage current.

In the present embodiment, since the gate electrode 24 includes the n-type second portion 32 facing at least a portion of the drift region 10 with the gate insulating film 23 interposed therebetween, it is possible to suppress a damage to the gate insulating film 23. The reason for this will be explained below.

The higher the p-type impurity concentration in the drift region, the more likely the impact ionization occurs. In the present embodiment, the gate electrode 24 includes the n-type second portion 32 facing at least a portion of the drift region 10 with the gate insulating film 23 interposed therebetween. Thus, the vicinity of the gate insulating film 23 in the region of the p-type drift region 10 facing the second portion 32 tends to attract electrons (tends to undergo n-type inversion). Thus, the vicinity of the gate insulating film 23 in the region of the p-type drift region 10 facing the second portion 32 becomes a state in which holes are few, that is, a state in which the p-type impurity concentration (acceptor concentration) is low. This reduces an impact ionization rate and suppresses generation of hot electrons. As a result, it is possible to reduce the number of electrons trapped in the gate insulating film 23, thereby suppressing a damage to the gate insulating film 23.

It is desirable that the n-type second portion 32 faces a region in the drift region 10 where impact ionization is likely to occur in the gate electrode 24 with the gate insulating film 23 interposed therebetween. Therefore, in the present embodiment, the second portion 32 is formed to face the region of the channel region 20 closer to the drift region 10 and the region of the drift region 10 closer to the channel region 20 with the gate insulating film 23 interposed therebetween.

The reason that the vicinity of the gate insulating film 23 in the region of the p-type drift region 10 facing the second portion 32 tends to attract electrons (tends to undergo n-type inversion) will be described below.

Figure 3:
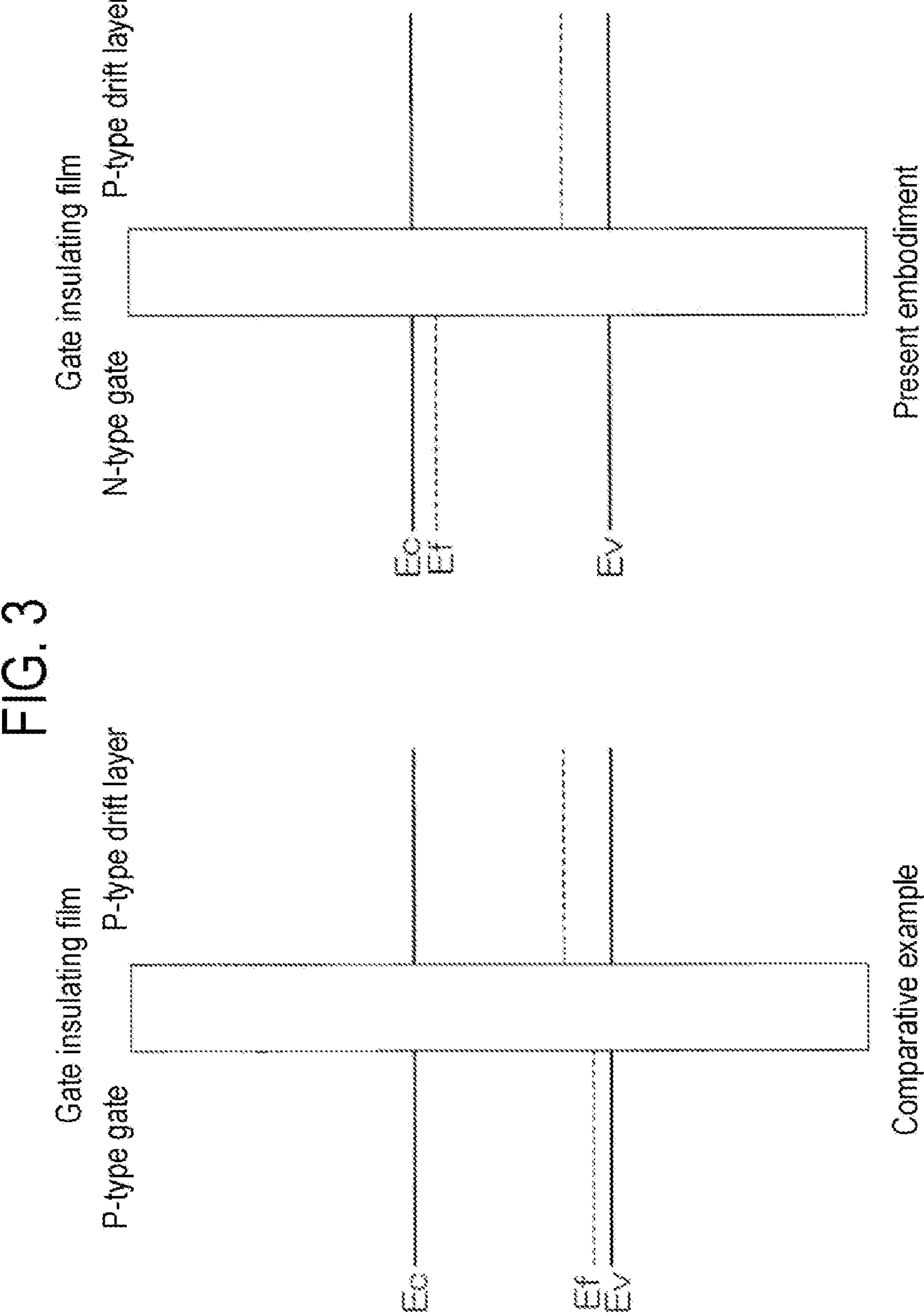
FIG. 3 is an energy band diagram showing energy bands for a p-type gate electrode, a gate insulating film, and a p-type drift region in a comparative example, and energy bands for an n-type second portion of a gate electrode, a gate insulating film, and a p-type drift region in the present embodiment.

A left side in FIG. 3 shows an energy band for a p-type gate electrode (denoted as a "p-type gate" in FIG. 3), the gate insulating film 23, and the p-type drift region 10 in the comparative example. A right side in FIG. 3 shows the energy band for the second portion 32 of the gate electrode 24 (denoted as "n-type gate" in FIG. 3), the gate insulating film 23 and the p-type drift region 10 in the present embodiment.

In FIG. 3, Ec indicates a conduction band edge energy, Ef indicates a Fermi level, and Ev indicates a valence band edge energy. The same applies to FIGS. 4 and 5 as well.

Since the gate electrode is a p type in the comparative example, the Fermi level Ef of the gate electrode exists at a position close to the valence band edge energy Ev. On the other hand, in the present embodiment, since the second portion 32 of the gate electrode 24 is an n type, the Fermi level Ef of the second portion 32 of the gate electrode 24 exists at a position close to the conduction band edge energy Ec.

Figure 4:
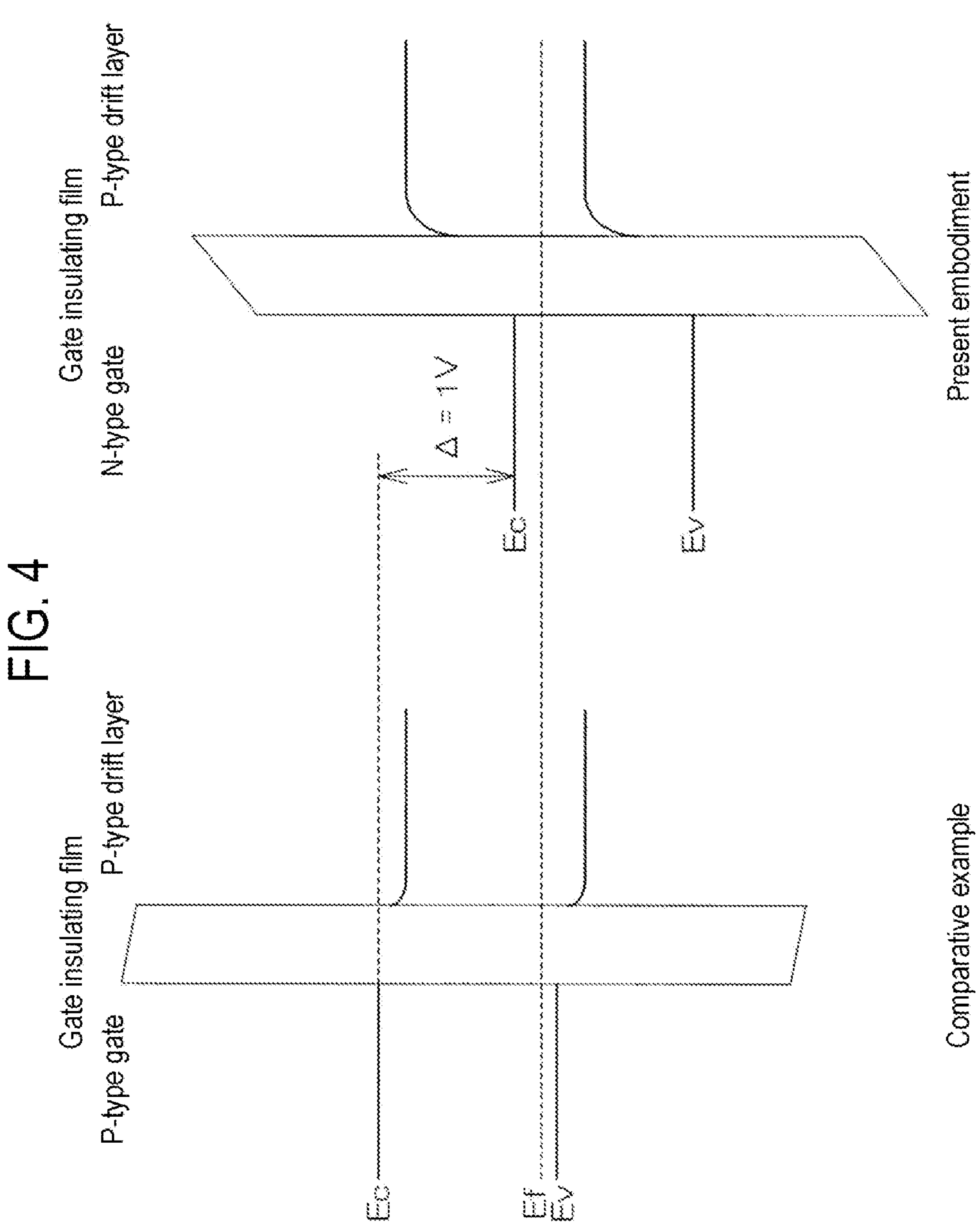
FIG. 4 is an energy band diagram showing energy bands when a p-type gate electrode and a p-type drift region are joined through a gate insulating film in a comparative example, and energy bands when an n-type second portion of the gate electrode and a p-type drift region are joined through a gate insulating film in the present embodiment.

A left side in FIG. 4 shows an energy band (energy band in a thermal equilibrium state) when the p-type gate electrode and the p-type drift region 10 are joined through the gate insulating film 23 in the comparative example. A right side in FIG. 4 shows an energy band (energy band in a thermal equilibrium state) when the n-type second portion 32 of the gate electrode 24 and the p-type drift region 10 are joined through the gate insulating film 23 in the present embodiment.

In the comparative example, the energy band of the p-type drift region 10 is bent such that the valence band edge energy Ev approaches the Fermi level Ef on the surface on the gate insulating film 23 side. As a result, holes tend to be accumulated in a surface layer portion of the p-type drift region 10.

The conduction band edge energy Ec of the n-type second portion 32 of the gate electrode 24 in the present embodiment is about 1 V larger than the conduction band edge energy Ec of the gate electrode in the comparative example. Thus, in the present embodiment, the energy band of the p-type drift region 10 is bent such that the conduction band edge energy Ec approaches the Fermi level Ef on the surface on the gate insulating film 23 side. Therefore, electrons tend to be accumulated in the surface layer portion of the p-type drift region 10.

Figure 5:
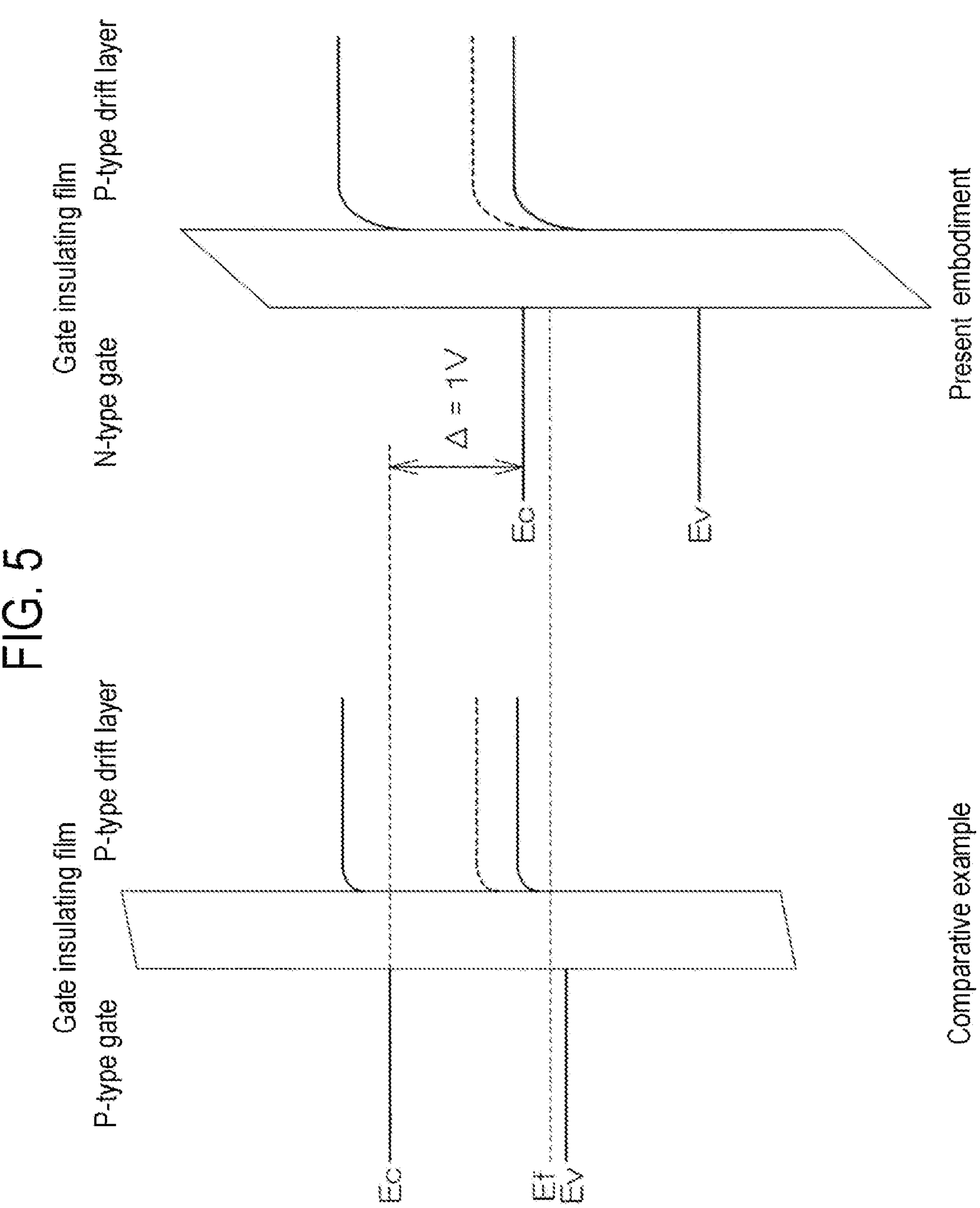
FIG. 5 is an energy band diagram showing energy bands when 0 V is applied to a source region, −80 V is applied to a drain region, and −1.5 V is applied to a gate electrode in a comparative example, and energy bands when similar voltages are applied to a source region, a drain region, and a gate electrode in the present embodiment.

A left side in FIG. 5 shows an energy band when 0 V is applied to the source region 13, −80 V is applied to the drain region 11, and −1.5 V is applied to the gate electrode in the comparative example. A right side in FIG. 5 shows an energy band when similar voltages are applied to the source region 13, the drain region 11, and the gate electrode 24 in the present embodiment.

When such a voltage is applied, a potential difference of about 3 V is generated in the gate insulating film. Therefore, in the comparative example and the present embodiment, the energy band of the p-type drift region 10 is lifted upward by 3 V from the thermal equilibrium state.

As a result, in the present embodiment, on the surface of the p-type drift region 10 on the gate insulating film 23 side, a drop at a portion where the conduction band edge energy Ec sags toward the Fermi level Ef side is increased. As a result, electrons are more easily accumulated in the surface layer portion of the p-type drift region 10. That is, the surface layer portion of the p-type drift region 10 is in a state where n-type inversion is likely to occur.

Also in the comparative example, on the surface of the p-type drift region 10 on the gate insulating film 23 side, the conduction band edge energy Ec is bent to approach the Fermi level Ef. However, an effect of accumulating electrons in the surface layer portion of the p-type drift region 10 is lower than in the present embodiment because the drop at the portion where the conduction band edge energy Ec sags toward the Fermi level Ef side is small.

A manufacturing process of the semiconductor device 1 shown in FIG. 1 will be described with reference to FIGS. 6A to 6L. FIGS. 6A to 6L are cross-sectional views for explaining an example of the manufacturing process of the semiconductor device 1, and are cross-sectional views corresponding to the cross section of FIG. 1.

Figure 6A:
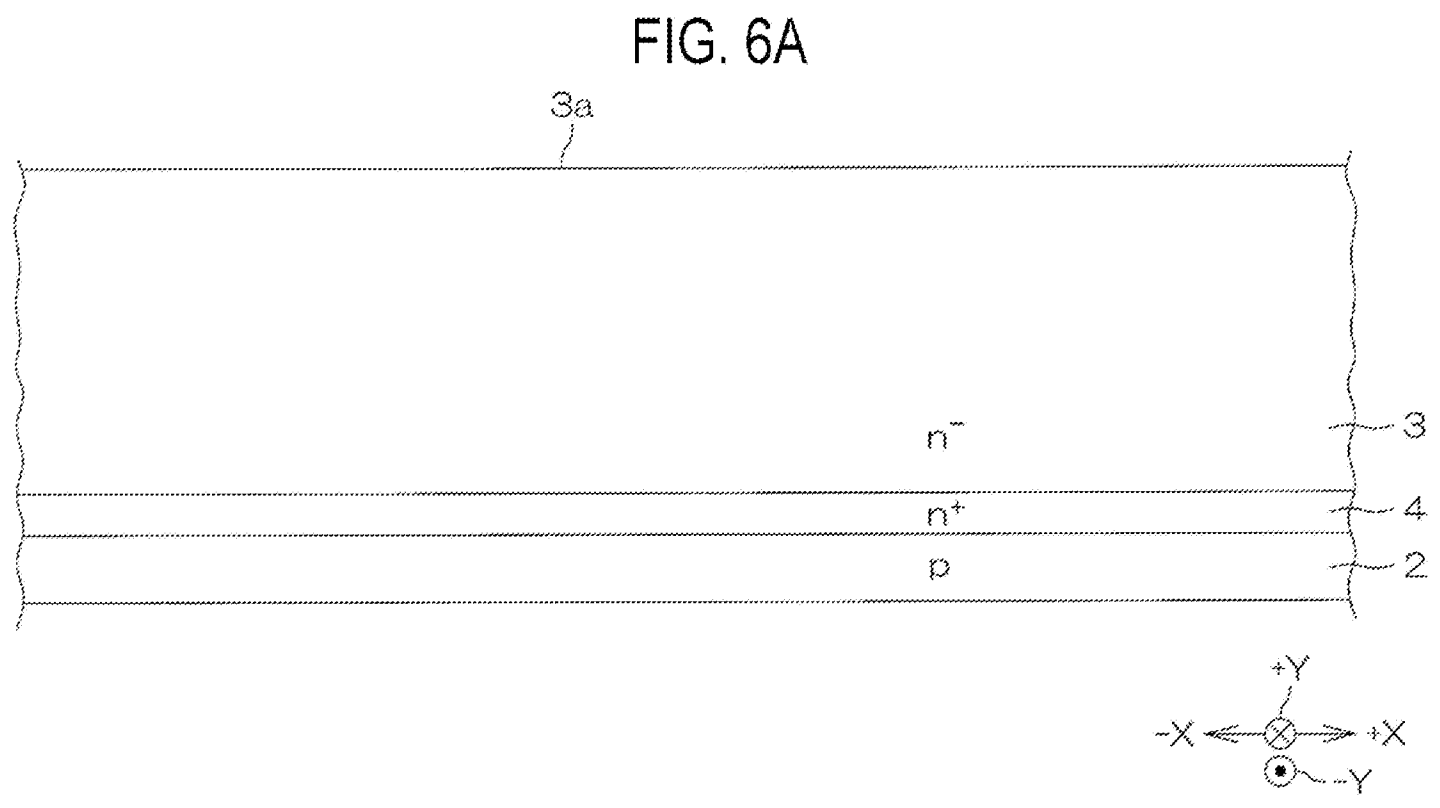

First, a p-type semiconductor substrate 2 is prepared. Next, an n-type impurity is selectively implanted into a surface of the semiconductor substrate 2 to form an n-type embedded layer 4. Then, under a heating condition of, for example, 1,100 degrees C. or higher, silicon is allowed to epitaxially grow on the semiconductor substrate 2 while adding an n-type impurity. Thus, an n-type epitaxial layer 3 is formed on the semiconductor substrate 2 as shown in FIG. 6A.

When the epitaxial layer 3 grows, the n-type impurity implanted into the semiconductor substrate 2 diffuses in a growth direction of the epitaxial layer 3. As a result, an n-type embedded layer 4 straddling the boundary between the semiconductor substrate 2 and the epitaxial layer 3 is formed.

Figure 6B:
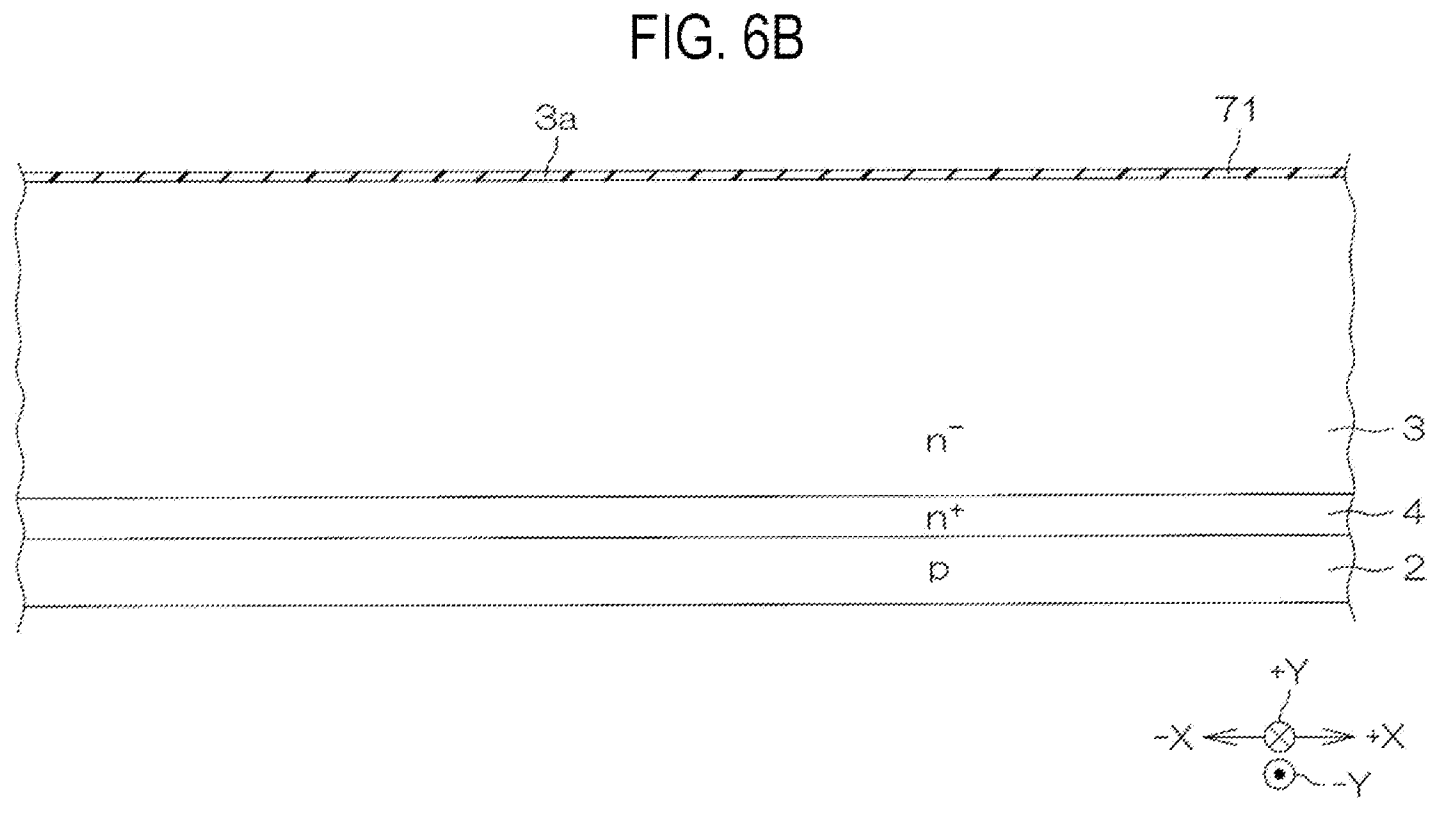

Next, as shown in FIG. 6B, a base insulating film 71 (having a thickness of, e.g., 5 nm to 50 nm) is formed on an element main surface 3*a* of the epitaxial layer 3 by a method such as, for example, thermal oxidation or the like. The base insulating film 71 is made of silicon oxide ($SiO_2$) in the present embodiment.

Figure 6C:
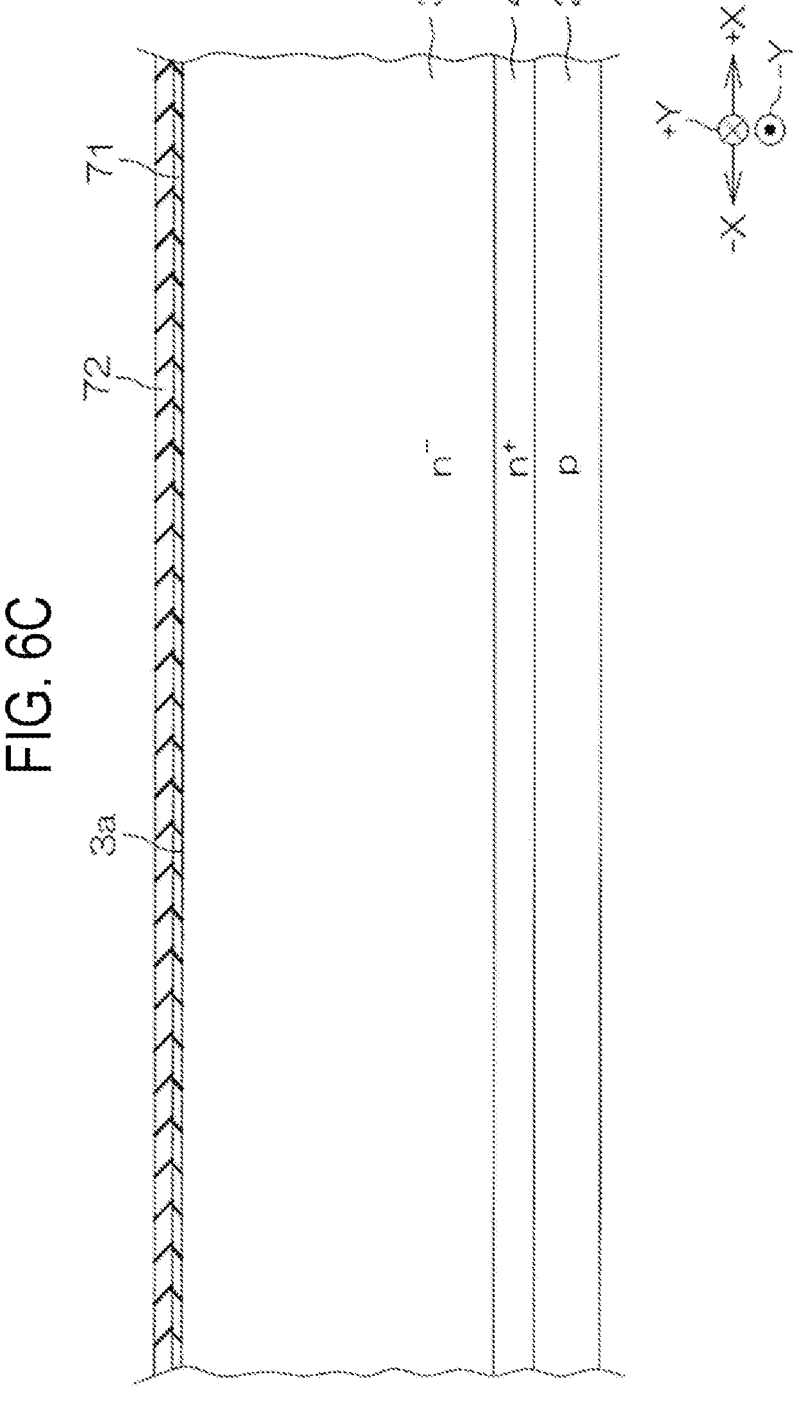
FIG. 6C is a cross-sectional view showing a next step of FIG. 6B.

Next, as shown in FIG. 6C, a mask insulating film 72 (having a thickness of, e.g., 80 nm to 200 nm) is deposited on the base insulating film 71 by a method such as, for example, a low pressure CVD method or the like. The mask insulating film 72 is made of silicon nitride (SiN) in the present embodiment.

Figure 6D:
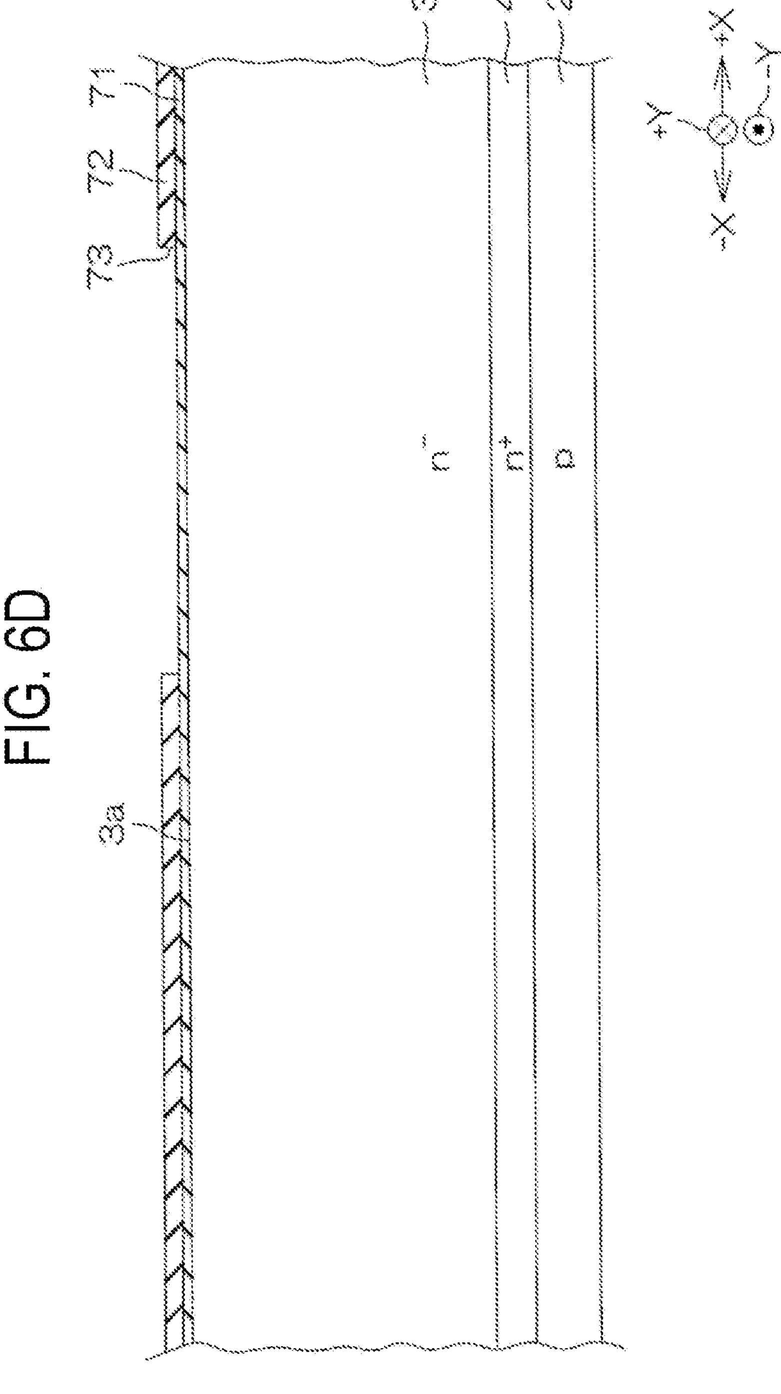
FIG. 6D is a cross-sectional view showing a next step of FIG. 6C.

Next, as shown in FIG. 6D, by photolithography and etching, an opening 73 is formed in a region of the mask insulating film 72 opposite to a region where the field insulating film 21 is formed.

Figure 6E:
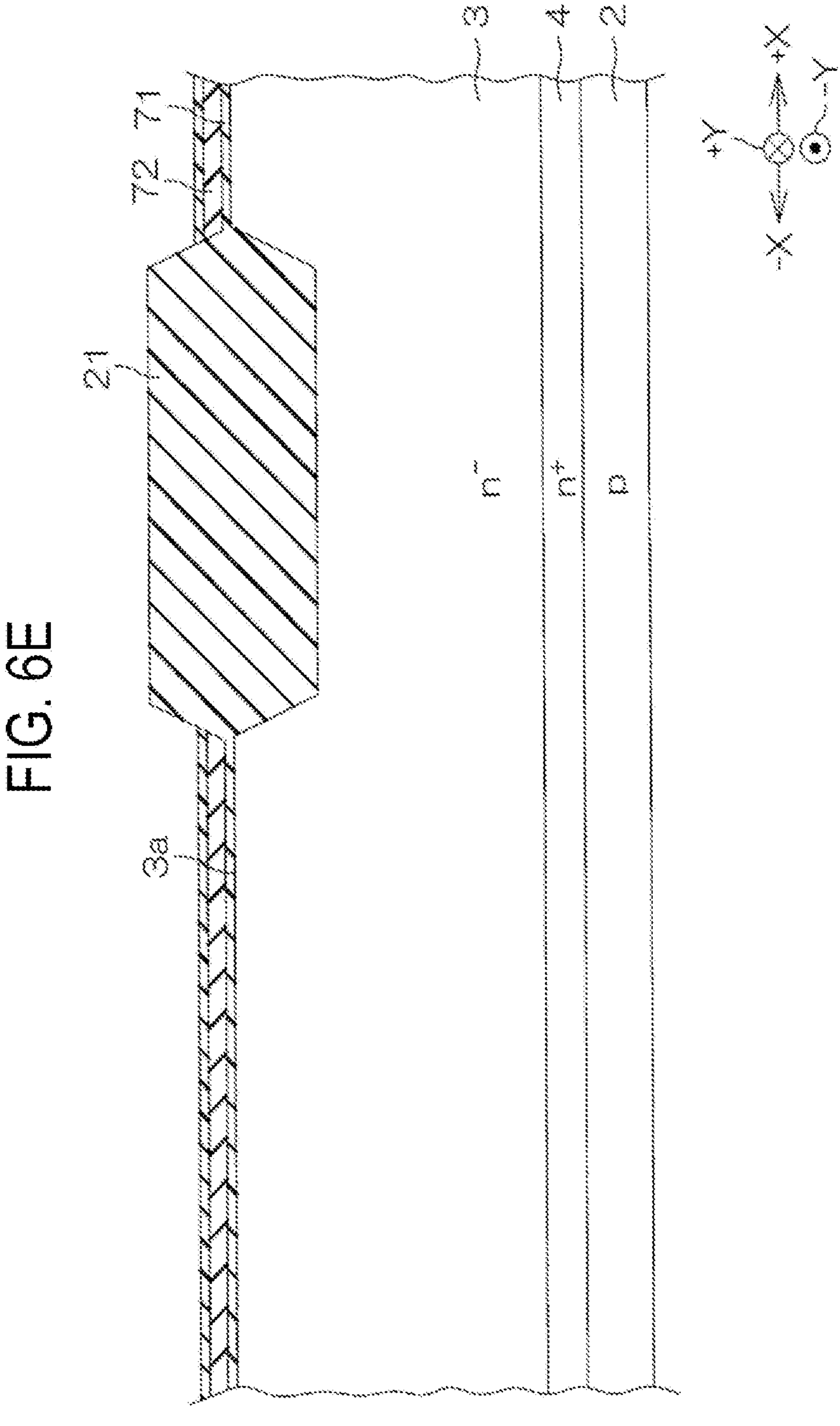
FIG. 6E is a cross-sectional view showing a next step of FIG. 6D.

Next, as shown in FIG. 6E, by thermally oxidizing a portion of the epitaxial layer 3 exposed from the opening 73 of the mask insulating film 72, the base insulating film 71 is thickened, and a field insulating film 21 composed of a LOCOS oxide film is formed on the surface layer portion of the epitaxial layer 3 on the element main surface 3*a* side.

Figure 6F:
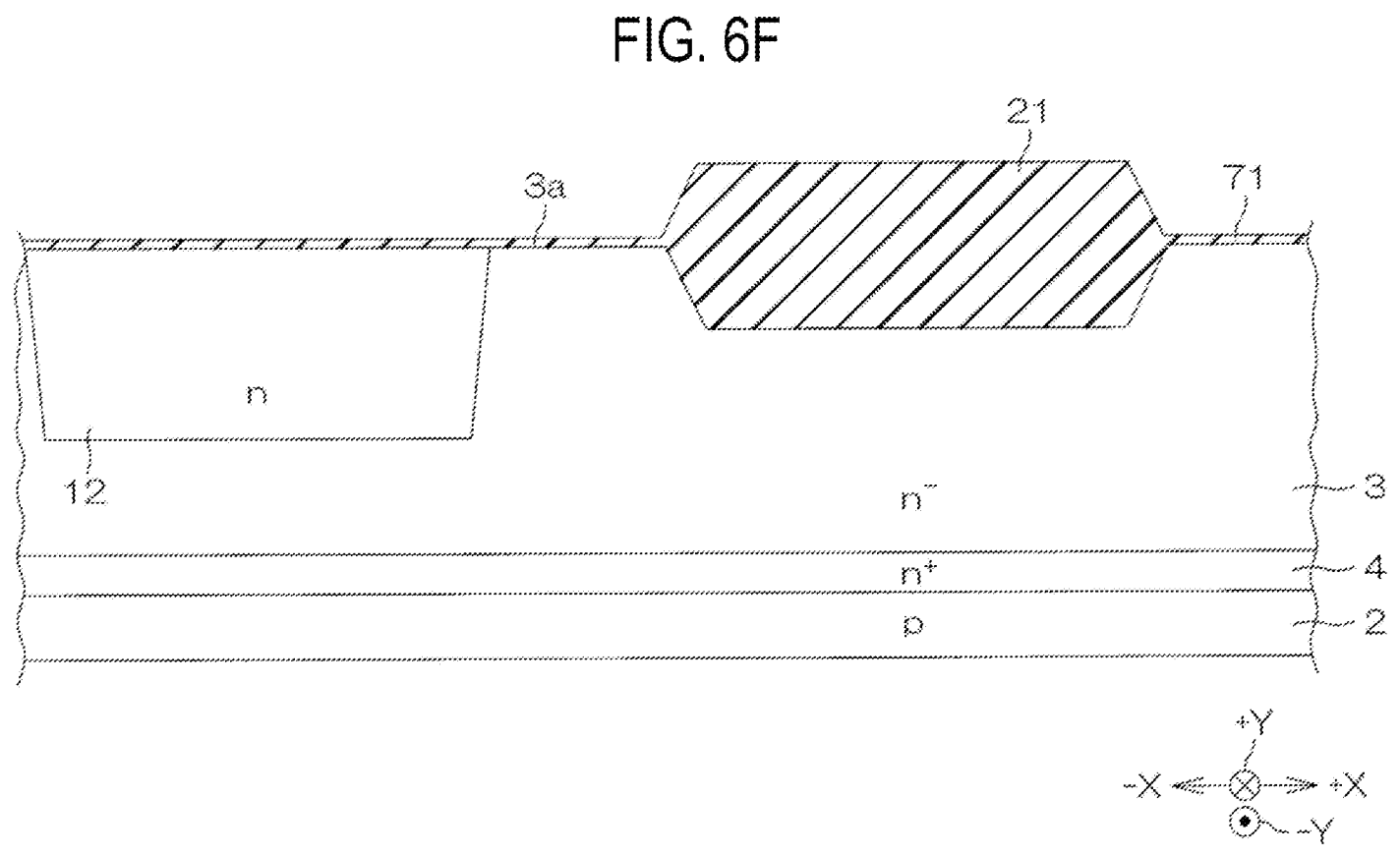

Next, as shown in FIG. 6F, the mask insulating film 72 is removed, for example, by etching with hydrogen fluoride water or the like. Thereafter, an n-type body region 12 is formed in the surface layer portion of the epitaxial layer 3 on the element main surface 3*a* side. When forming the body region 12, first, an ion implantation mask (not shown), which has an opening selectively formed in a region where the body region 12 is to be formed, is formed. Then, an n-type impurity is implanted into the epitaxial layer 3 through the ion implantation mask. Thus, the body region 12 is formed. Thereafter, the ion implantation mask is removed.

Figure 6G:
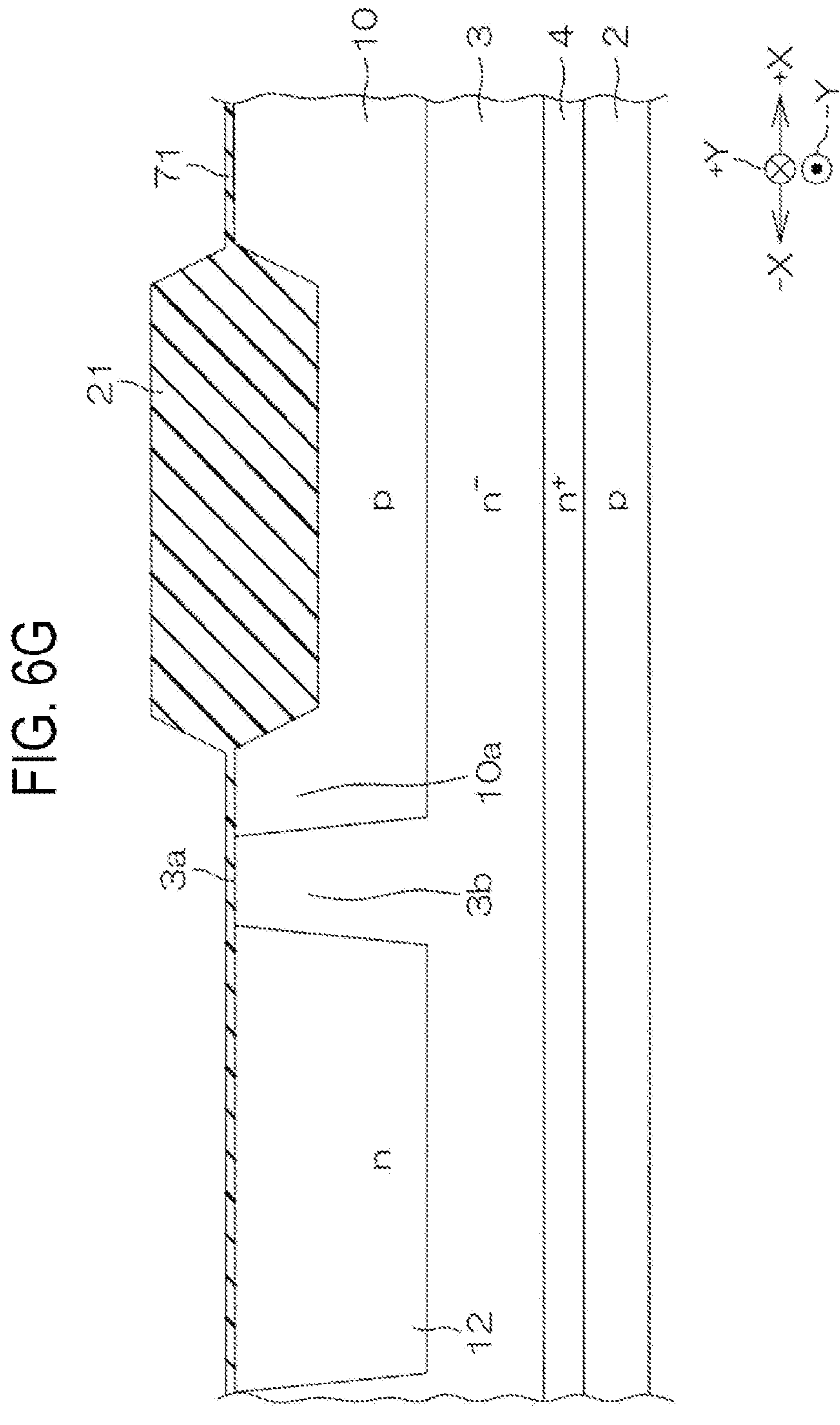
FIG. 6G is a cross-sectional view showing a next step of FIG. 6F.

Next, as shown in FIG. 6G, a p-type drift region 10 is formed in the surface layer portion of the epitaxial layer 3 on the element main surface 3*a* side. When forming the drift region 10, first, an ion implantation mask (not shown), which has an opening selectively formed in a region where the drift region 10 is to be formed, is formed. Then, a p-type impurity is implanted into the epitaxial layer 3 through the ion implantation mask. Thus, the drift region 10 is formed. Thereafter, the ion implantation mask is removed.

Figure 6H:
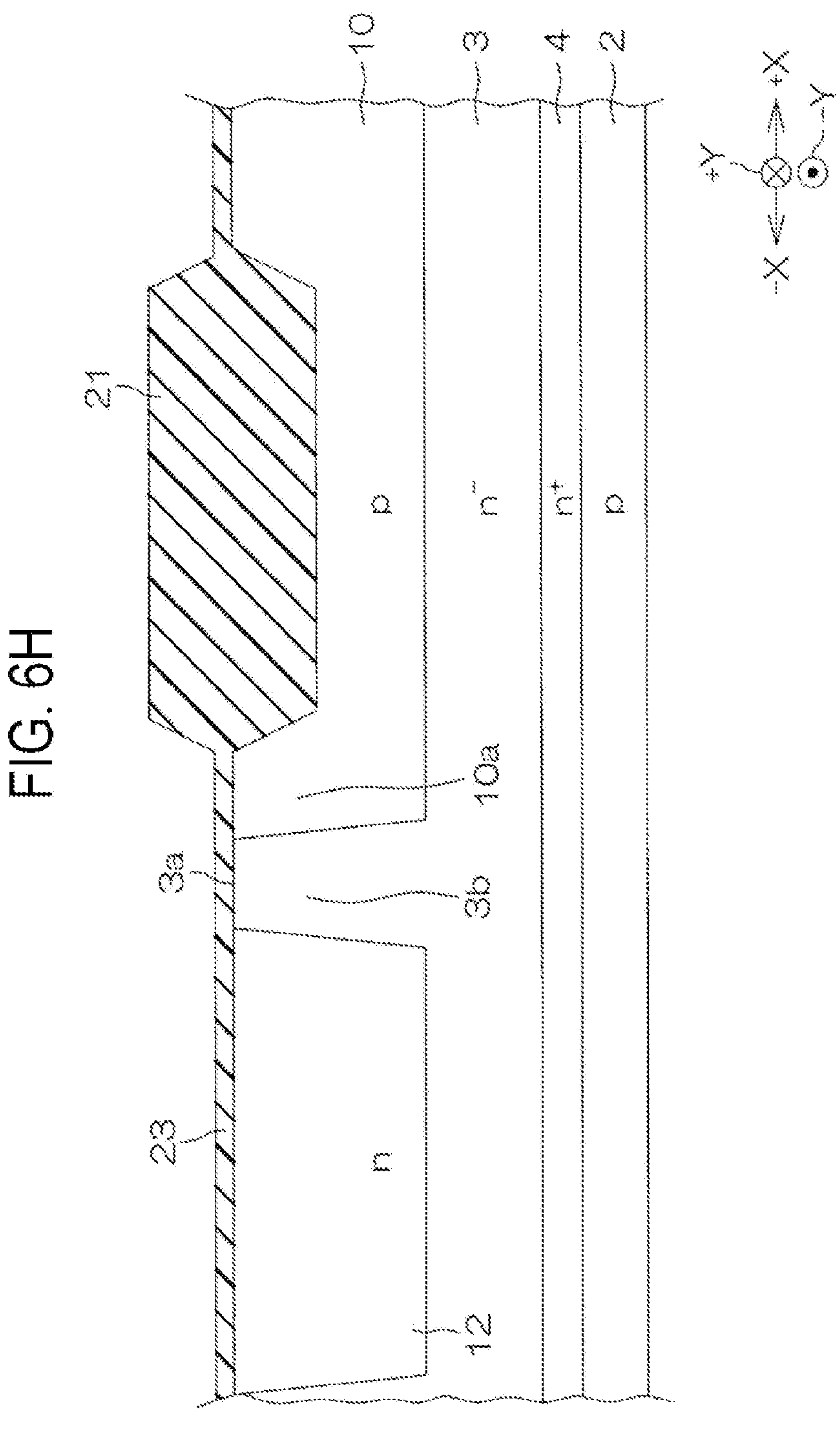
FIG. 6H is a cross-sectional view showing a next step of FIG. 6G.

Next, as shown in FIG. 6H, the surfaces of the base insulating film 71 and the field insulating film 21 are thermally oxidized. As a result, the base insulating film 71 is thickened and a gate insulating film 23 is formed.

Figure 6I:
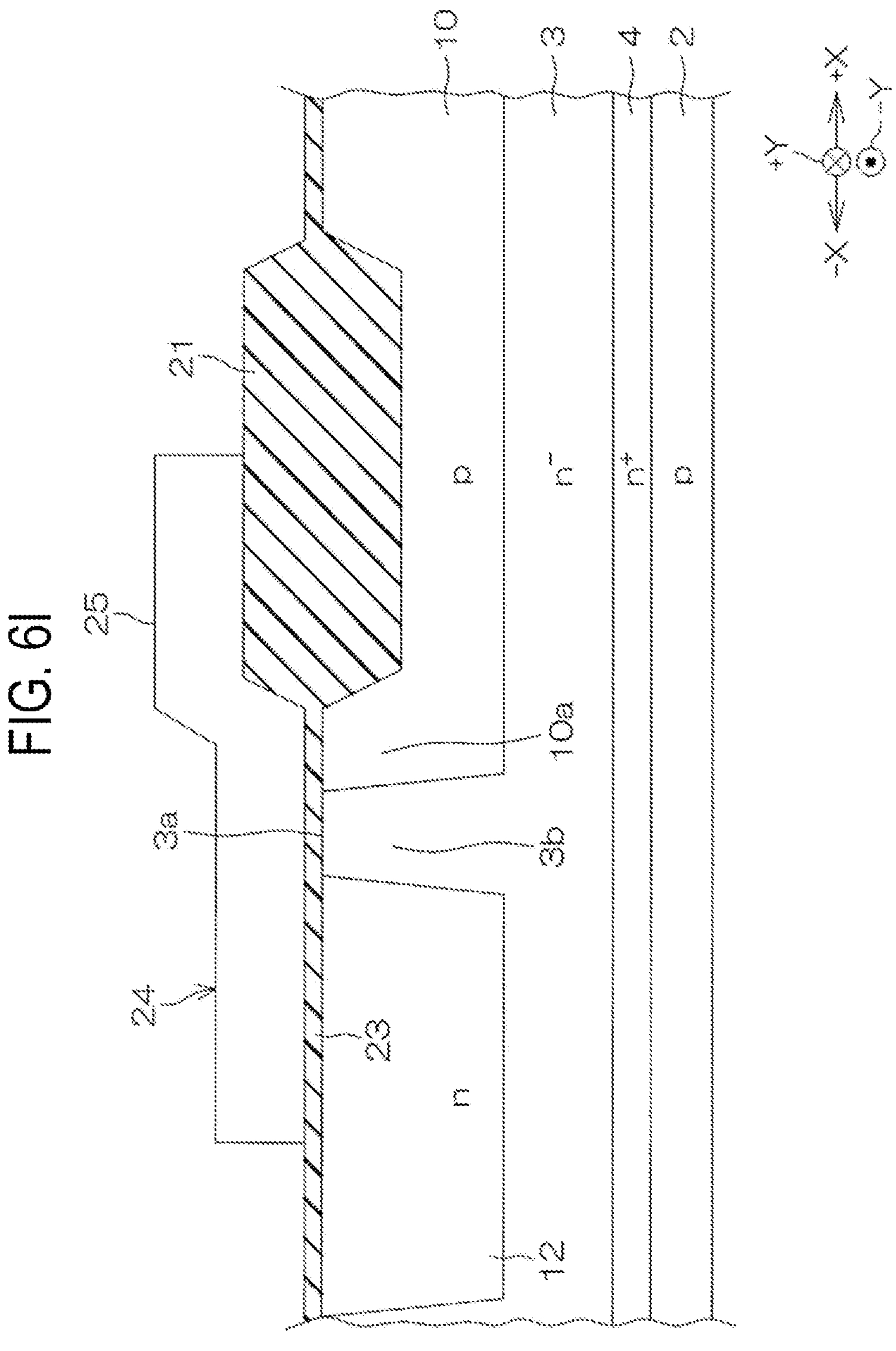
FIG. 6I is a cross-sectional view showing a next step of FIG. 6H.

Next, polysilicon is deposited on the entire element main surface 3*a* of the epitaxial layer 3 by, for example, a low-pressure CVD method or the like. Thereafter, as shown in FIG. 6I, a gate electrode 24 made of polysilicon is formed by going through a photolithography process.

Figure 6J:
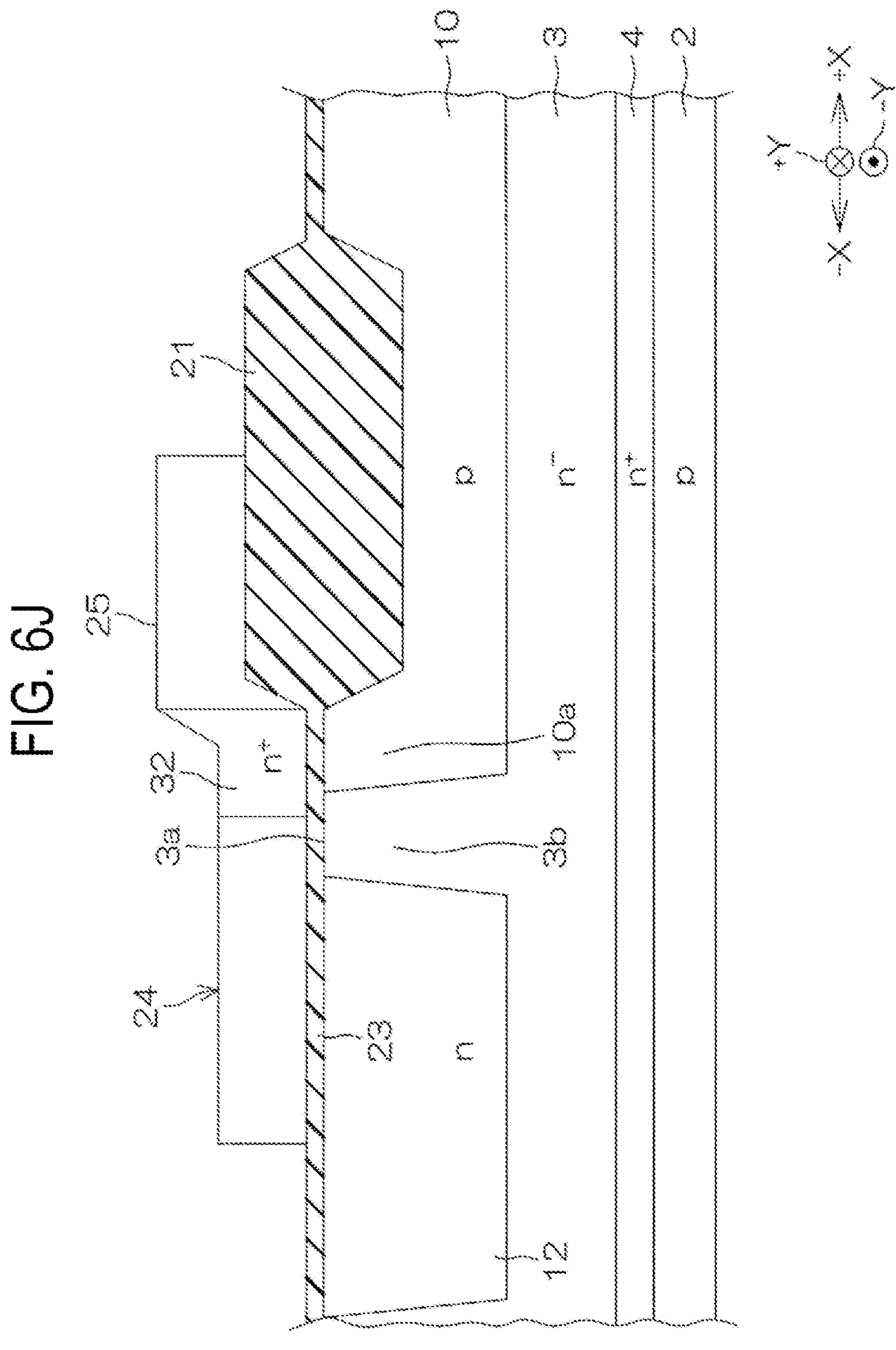
FIG. 6J is a cross-sectional view showing a next step of FIG. 6I.

Next, as shown in FIG. 6J, an n-type body contact region 14 (see FIG. 2) is formed in the surface layer portion of the body region 12, and an n-type second portion 32 is formed in the gate electrode 24. When forming the body contact region 14 and the second portion 32, first, an ion implantation mask (not shown), which has openings selectively formed in a region where the body contact region 14 is to be formed and a region where the second portion 32 is to be formed, is formed. Then, an n-type impurity is implanted into the body region 12 and the gate electrode 24 through the ion implantation mask. Thus, the body contact region 14 and the second portion 32 are formed. Thereafter, the ion implantation mask is removed.

Figure 6K:
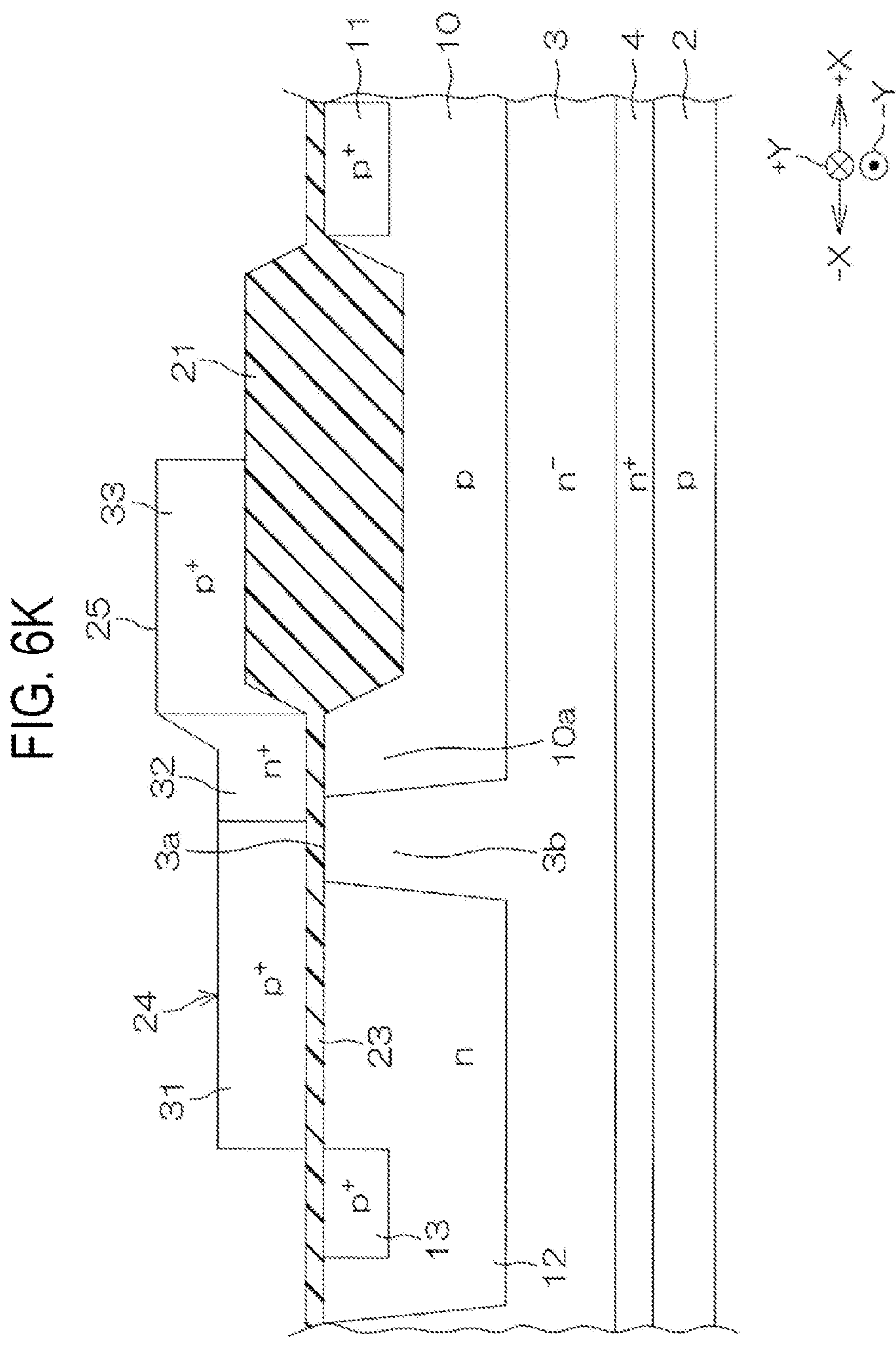
FIG. 6K is a cross-sectional view showing a next step of FIG. 6J.

Next, as shown in FIG. 6K, a p-type source region 13 is formed in the surface layer portion of the body region 12, a p-type drain region 11 is formed in the surface layer portion of the drift region 10, and a p-type first portion 31 and a p-type third portion 33 are formed in the gate electrode 24.

When forming the source region 13, the drain region 11, and the first and third portions 31 and 33 of the gate electrode 24, first, an ion implantation mask (not shown), which has openings selectively formed in the regions where the source region 13, the drain region 11, and the first portion 31 and the third portion 33 are to be formed, is formed. Then, a p-type impurity is implanted into the body region 12, the drift region 10, and the gate electrode 24 through the ion implantation mask. Thus, the source region 13, the drain region 11, and the first portion 31 and the third portion 33 of the gate electrode 24 are formed. Thereafter, the ion implantation mask is removed.

Figure 6L:
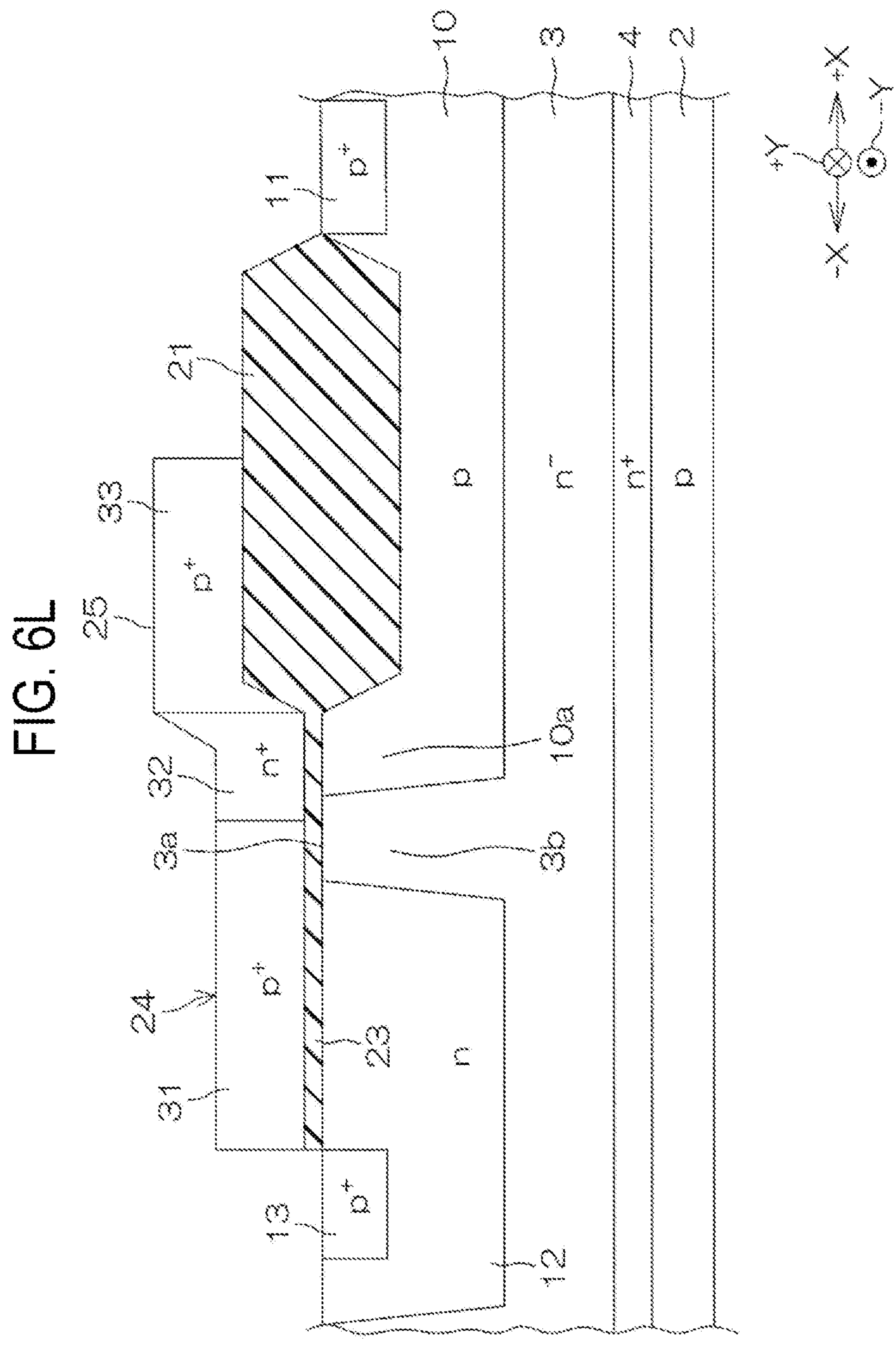
FIG. 6L is a cross-sectional view showing a next step of FIG. 6K.

Next, as shown in FIG. 6L, a hard mask (not shown) having an opening selectively formed to remove an unnecessary portion of the gate insulating film 23 is formed on the epitaxial layer 3. Then, the unnecessary portion of the gate insulating film 23 is etched through the hard mask. Thus, a predetermined gate insulating film 23 is formed. As a result, the surfaces of the drain region 11, the source region 13, and the body contact region 14 are exposed. Thereafter, the hard mask is removed.

Finally, a plurality of drain contact electrodes 41 electrically connected to the drain region 11, a plurality of source contact electrodes 42 electrically connected to the source region 13, a plurality of body contact electrodes 43 electrically connected to the body contact region 14, and a plurality of gate contact electrodes 44 electrically connected to the gate electrodes 18 are formed. Thus, the semiconductor device 1 shown in FIGS. 1 and 2 is obtained.

In the above-described embodiment, the body contact region 14, the source region 13, and the drain region 11 are formed after the gate electrode 24 made of polysilicon is formed in FIG. 6I. Alternatively, the body contact region 14, the source region 13, and the drain region 11 may be formed before the gate electrode 24 is formed.

Although the embodiment of the present disclosure has been described in detail above, this is nothing more than a specific example used to clarify the technical content of the present disclosure. The present disclosure should not be construed to be limited to this specific example. The scope of the present disclosure is limited only by the appended claims.

The features described as supplementary notes below can be extracted from the description in the specification and drawings.

[Supplementary Note 1-1]

A semiconductor device comprising: an n-type semiconductor layer (3); a p-type drift region (10) formed in a surface layer portion of the semiconductor layer (3); an n-type body region (12) formed in the surface layer portion of the semiconductor layer (3) so as to be spaced apart from or adjacent to the drift region (10); a p-type drain region (11) formed in a surface layer portion of the drift region (10); a p-type source region (13) formed in a surface layer portion of the body region (12); a gate insulating film (23) formed on a surface of the semiconductor layer (3) so as to straddle the drift region (10) and the body region (12); and a polysilicon gate (24) formed on the gate insulating film (23), wherein a region extending from the source region (13) in the body region (12) to a side edge of the drift region (10) on the body region (12) side is a channel region (20), and wherein the polysilicon gate (24) includes a p-type first portion (31) facing at least a portion of the channel region (20) with the gate insulating film (23) interposed therebetween, and an n-type second portion (32) facing at least a portion of the drift region (10) with the gate insulating film (23) interposed therebetween.

[Supplementary Note 1-2]

The semiconductor device of Supplementary Note 1-1, wherein the first portion (31) faces a region (Q) of the channel region (20) except a region (S1) closer to the drift region (10) with the gate insulating film (23) interposed therebetween, and the second portion (32) faces a region (S1) of the channel region (20) closer to the drift region (10) and a region (S2) of the drift region (10) closer to the channel region (20) with the gate insulating film (23) interposed therebetween.

[Supplementary Note 1-3]

The semiconductor device of Supplementary Note 1-2, wherein a field insulating film (21), which selectively covers the drift region (10) and is connected to the gate insulating film (23), is formed on the surface of the semiconductor layer (3) between the gate insulating film (23) and the drain region (11), and wherein the second portion (32) faces a region (S1) of the channel region (20) closer to the drift region (10) and a region (S2) of the drift region (10) extending from a side edge of the channel region (20) of the drift region (10) to the field insulating film (21) with the gate insulating film (23) interposed therebetween.

[Supplementary Note 1-4]

The semiconductor device of Supplementary Note 1-3, wherein the polysilicon gate (24) includes a lead portion (25) extending from above the gate insulating film (23) to above the field insulating film (21), and wherein the lead portion (25) includes a p-type third region (33).

[Supplementary Note 1-5]

The semiconductor device of Supplementary Note 1-3, wherein the gate insulating film (23) has a thickness smaller than a thickness of the field insulating film (21).

[Supplementary Note 1-6]

The semiconductor device of any one of Supplementary Notes 1-1 to 1-5, wherein the gate insulating film (23) includes a silicon oxide film.

[Supplementary Note 1-7]

The semiconductor device of Supplementary Note 1-3, wherein the field insulating film (21) includes a LOCOS film.

[Supplementary Note 1-8]

The semiconductor device of any one of Supplementary Notes 1-1 to 1-7, further comprising: an n-type body contact region (14) formed in a surface layer portion of the body region (12).

[Supplementary Note 1-9]

A method of manufacturing a semiconductor device, comprising: forming an n-type body region (12) and a p-type drift region (10) in a surface layer portion of an n-type semiconductor layer (3) so as to be spaced apart from each other or adjacent to each other; forming a gate insulating film (23) on a surface of the semiconductor layer (3) so as to straddle the body region (12) and the drift region (10); forming a polysilicon gate (24) on the gate insulating film (23); forming a p-type first portion (31) in the polysilicon gate (24); forming an n-type second portion (32) in the polysilicon gate (24); forming a p-type source region (13) in a surface layer portion of the body region (12); and forming a p-type drain region (11) in the surface layer portion of the drift region (10), wherein when a region extending from the source region (13) in the body region (12) to a side edge of the drift region (10) on the body region (12) side is a channel region (20), the first portion (31) faces at least a portion of the channel region (20) with the gate insulating film (23) interposed therebetween, and the second portion (32) faces at least a portion of the drift region (10) with the gate insulating film (23) interposed therebetween.

[Supplementary Note 1-10]

The method of Supplementary Note 1-9, wherein the first portion (31) faces a region (Q) of the channel region (20) except a region (S1) closer to the drift region (10) with the gate insulating film (23) interposed therebetween, and wherein the second portion (32) faces a region (S1) of the channel region (20) closer to the drift region (10) and a region (S2) of the drift region (10) closer to the channel region (20) with the gate insulating film (23) interposed therebetween.

[Supplementary Note 1-11]

The method of Supplementary Note 1-9, further comprising: forming a field insulating film (21) selectively covering the drift region (10) and connected to the gate insulating film (23) on the surface of the semiconductor layer (3) between the gate insulating film (23) and the drain region (11), wherein the second portion (32) faces a region (S1) of the channel region (20) closer to the drift region (10) and a region (S2) of the drift region (10) extending from a side edge of the channel region (20) of the drift region (10) to the field insulating film (21) with the gate insulating film (23) interposed therebetween.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:

an n-type semiconductor layer;

a p-type drift region formed in a surface layer portion of the semiconductor layer;

an n-type body region formed in the surface layer portion of the semiconductor layer so as to be spaced apart from or adjacent to the drift region;

a p-type drain region formed in a surface layer portion of the drift region;

a p-type source region formed in a surface layer portion of the body region;

a gate insulating film formed on a surface of the semiconductor layer so as to straddle the drift region and the body region; and a polysilicon gate formed on the gate insulating film, wherein a region extending from the source region in the body region to a side edge of the drift region on the body region side is a channel region, and wherein the polysilicon gate includes a p-type first portion facing at least a portion of the channel region with the gate insulating film interposed therebetween, and an n-type second portion facing at least a portion of the drift region with the gate insulating film interposed therebetween.

2. The semiconductor device of claim 1, wherein the first portion faces a region of the channel region except a region closer to the drift region with the gate insulating film interposed therebetween, and the second portion faces a region of the channel region closer to the drift region and a region of the drift region closer to the channel region with the gate insulating film interposed therebetween.

3. The semiconductor device of claim 2, wherein a field insulating film, which selectively covers the drift region and is connected to the gate insulating film, is formed on the surface of the semiconductor layer between the gate insulating film and the drain region, and wherein the second portion faces a region of the channel region closer to the drift region and a region of the drift region extending from a side edge of the channel region of the drift region to the field insulating film with the gate insulating film interposed therebetween.

4. The semiconductor device of claim 3, wherein the polysilicon gate includes a lead portion extending from above the gate insulating film to above the field insulating film, and wherein the lead portion includes a p-type third region.

5. The semiconductor device of claim 3, wherein the gate insulating film has a thickness smaller than a thickness of the field insulating film.

6. The semiconductor device of claim 1, wherein the gate insulating film includes a silicon oxide film.

7. The semiconductor device of claim 3, wherein the field insulating film includes a LOCOS film.

8. The semiconductor device of claim 1, further comprising:

an n-type body contact region formed in the surface layer portion of the body region.

* * * * *